United States Patent
Wu et al.

(10) Patent No.: US 12,108,682 B2
(45) Date of Patent: Oct. 1, 2024

(54) SEMICONDUCTOR STRUCTURE, MEMORY CELL AND MEMORY ARRAY

(71) Applicant: CHANGXIN MEMORY TECHNOLOGIES, INC., Hefei (CN)

(72) Inventors: Baolei Wu, Hefei (CN); Xiaoguang Wang, Hefei (CN); Yulei Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 496 days.

(21) Appl. No.: 17/386,455

(22) Filed: Jul. 27, 2021

(65) Prior Publication Data
US 2022/0190236 A1    Jun. 16, 2022

Related U.S. Application Data

(63) Continuation of application No. PCT/CN2021/095445, filed on May 24, 2021.

(30) Foreign Application Priority Data

Dec. 15, 2020 (CN) .......................... 202011475752.5

(51) Int. Cl.
| | | |
|---|---|---|
| *H10N 50/10* | (2023.01) | |
| *G11C 7/18* | (2006.01) | |
| *G11C 8/14* | (2006.01) | |
| *H01L 23/528* | (2006.01) | |
| *H10B 61/00* | (2023.01) | |
| *H10N 50/80* | (2023.01) | |

(52) U.S. Cl.
CPC ............... *H10N 50/10* (2023.02); *G11C 7/18* (2013.01); *G11C 8/14* (2013.01); *H01L 23/5283* (2013.01); *H10B 61/22* (2023.02); *H10N 50/80* (2023.02)

(58) Field of Classification Search
None
See application file for complete search history.

(56) References Cited

U.S. PATENT DOCUMENTS

| | | | |
|---|---|---|---|
| 6,649,953 B2 | 11/2003 | Cha | |
| 6,855,564 B2 | 2/2005 | Cha | |
| 9,142,277 B2 * | 9/2015 | Kim | .................... G11C 11/1659 |
| 9,620,190 B2 | 4/2017 | Lee et al. | |
| 9,659,623 B1 * | 5/2017 | Sadd | .................... G11C 11/1657 |

(Continued)

FOREIGN PATENT DOCUMENTS

| | | |
|---|---|---|
| CN | 1385905 A | 12/2002 |
| CN | 104733036 A | 6/2015 |

(Continued)

OTHER PUBLICATIONS

Supplementary European Search Report in the European application No. 21843572.5, mailed on Dec. 9, 2022, 6 pgs.

(Continued)

*Primary Examiner* — Ali Naraghi
*Assistant Examiner* — E. Rhett Cheek
(74) *Attorney, Agent, or Firm* — Kilpatrick Townsend & Stockton LLP

(57) ABSTRACT

Provided is a semiconductor structure, a memory cell and a memory array. An nT-MRAM can be realized by a relatively simple structure. Transistors connected to multiple MTJs are connected by connecting pads.

18 Claims, 7 Drawing Sheets

(56) References Cited

U.S. PATENT DOCUMENTS

| | | | |
|---|---|---|---|
| 10,170,185 B2 | 1/2019 | Manipatruni et al. | |
| 10,497,415 B2* | 12/2019 | Kim | G11C 29/44 |
| 10,861,524 B1* | 12/2020 | Roy | G11C 11/1693 |
| 2002/0140016 A1 | 10/2002 | Cha | |
| 2004/0061156 A1 | 4/2004 | Cha | |
| 2008/0308887 A1 | 12/2008 | Asao | |
| 2011/0254112 A1* | 10/2011 | Yamanaka | H10B 61/22 257/E29.323 |
| 2012/0218805 A1* | 8/2012 | Kim | G11C 29/30 365/158 |
| 2012/0286339 A1 | 11/2012 | Asao | |
| 2014/0021520 A1 | 1/2014 | Asao | |
| 2014/0306277 A1 | 10/2014 | Asao | |
| 2015/0035097 A1 | 2/2015 | Asao | |
| 2015/0255506 A1 | 9/2015 | Asao | |
| 2015/0294695 A1 | 10/2015 | Lee | |
| 2016/0071906 A1 | 3/2016 | Asao | |
| 2016/0300612 A1 | 10/2016 | Manipatruni | |
| 2018/0277171 A1* | 9/2018 | Matsuoka | G11C 5/063 |
| 2019/0305210 A1 | 10/2019 | Tahmasebi et al. | |

FOREIGN PATENT DOCUMENTS

| | | |
|---|---|---|
| CN | 104978991 A | 10/2015 |
| CN | 111489777 A | 8/2020 |
| CN | 212136451 U | 12/2020 |
| WO | 2019005129 A1 | 1/2019 |

OTHER PUBLICATIONS

Supplementary Partial European Search Report in the European application No. 21772655.3, mailed on Jul. 14, 2022, 9 pgs.

International Search Report in the international application No. PCT/CN2021/095596, mailed on Jun. 17, 2021, 2 pgs.

International Search Report in the international application No. PCT/CN2021/095445, mailed on Jun. 22, 2021, 2 pgs.

* cited by examiner

D4

D5

D6

D1-D3

D1-D4

D3

D1-D3

D1-D4

SEMICONDUCTOR STRUCTURE, MEMORY CELL AND MEMORY ARRAY

CROSS-REFERENCE TO RELATED APPLICATION

This application is a continuation of International Application No. PCT/CN2021/095445, filed on May 24, 2021, which claims priority to Chinese Patent Application No. 202011475752.5, filed with the China National Intellectual Administration on Dec. 15, 2020, and titled "Semiconductor Structure, Memory cell and Memory array". The contents of International Application No. PCT/CN2021/095445 and Chinese Patent Application No. 202011475752.5 are incorporated herein by reference in their entireties.

BACKGROUND

A Magnetoresistive Random Access Memory (MRAM) is a non-volatile magnetic random access memory which has the characteristics of higher reading and writing speed, higher integration level and more repeated reading and writing times, and is widely used in current devices such as computers.

In the related art, Magnetic Tunnel Junctions (MTJs) are specifically used to read, write and store information ("0" or "1") in the MRAM, and each MTJ can be driven by multiple transistors to increase the driving current in driving the MTJ. The MRAM in which one MTJ is driven by n transistors can also be called nT-MRAM. However, multiple transistors will occupy a larger area and reduce the memory density.

SUMMARY

The disclosure relates to the field of semiconductor technologies, and particularly relates to a semiconductor structure, a memory cell and a memory array.

In the first aspect, an example of the present disclosure provides a semiconductor structure, including: active regions that are separate from one another and located on a substrate; connecting pads, wherein each of the connecting pads includes a first part and a second part, each of the first part and the second part is connected to end parts of respective adjacent ones of the active regions, the first part extends in a first direction, and the second part extends in a second direction; and magnetic tunnel junctions (MTJs), wherein each of the MTJs is connected to a respective one of the connecting pads.

In the second aspect, an example of the present disclosure further provides a memory cell, including a transistor, and a memory structure, wherein one end of the transistor is connected to one end of the memory structure; and the other end of the transistor, a gate electrode of the transistor, the other end of the memory structure, and the end of the transistor connected to the memory structure are respectively used as a first end, a second end, a third end and a fourth end of the memory cell.

In the third aspect, an example of the present disclosure further provides a memory array, including: M*N memory cells forming an array of M rows and N columns, wherein both M and the N are positive integers greater than or equal to 2; M bit lines in one-to-one correspondence to the M rows of memory cells, wherein third ends of memory cells in each of the M rows are all connected to a corresponding one of the M bit lines; and N word lines in one-to-one correspondence to the N columns of memory cells, wherein second ends of memory cells in each of the N columns are all connected to a corresponding one of the N word lines, wherein a fourth end of a memory cell in an $X^{th}$ row and $Y^{th}$ column is connected to a fourth end of a memory cell in a $P^{th}$ row a $Q^{th}$ column, X is equal to P minus A, and Y is equal to Q minus B.

BRIEF DESCRIPTION OF THE DRAWINGS

In order to more clearly illustrate the technical solutions in the embodiments of this application, the drawings to be used in the embodiments or in description of the prior art will be briefly introduced below. It is apparent that the drawings in the following description are only some of the embodiments of this application, and those skilled in the art can obtain other drawings according to these drawings without creative efforts.

DETAILED DESCRIPTION

The technical solutions in the embodiments of the disclosure will be clearly and completely described below with reference to the drawings in the embodiments of the disclosure. It is apparent that the described embodiments are only a part of the embodiments of disclosure, but are not all of the embodiments. All other embodiments obtained by those of ordinary skill in the art based on the embodiments of the disclosure without creative efforts shall fall within the scope of protection of disclosure.

The terms "first", "second", "third", "fourth", etc. (if any) in the description, claims and the above drawings of the specification are used to distinguish similar objects, and are not used to describe a specific order or a sequential order. It should be understood that the data used in this way can be interchanged under appropriate conditions, so that the embodiments of the disclosure described herein can be implemented in a sequence other than those illustrated or described herein. In addition, the terms "include", "comprise" and any other variations thereof are intended to cover the non-exclusive inclusion. For example, a process, method, system, product, or device that includes a series of steps or units is not necessarily limited to those expressly listed steps or units, but may include other steps or units not expressly listed or inherent to such a process, method, product, or device.

The examples of the present disclosure provide a semiconductor structure, a memory cell and a memory array. An nT-MRAM can be realized by a relatively simple structure. Transistors connected to multiple MTJs are connected by connecting pads, thereby realizing the purpose of driving the same MTJ by n transistors without reducing the memory density.

Figure 1:
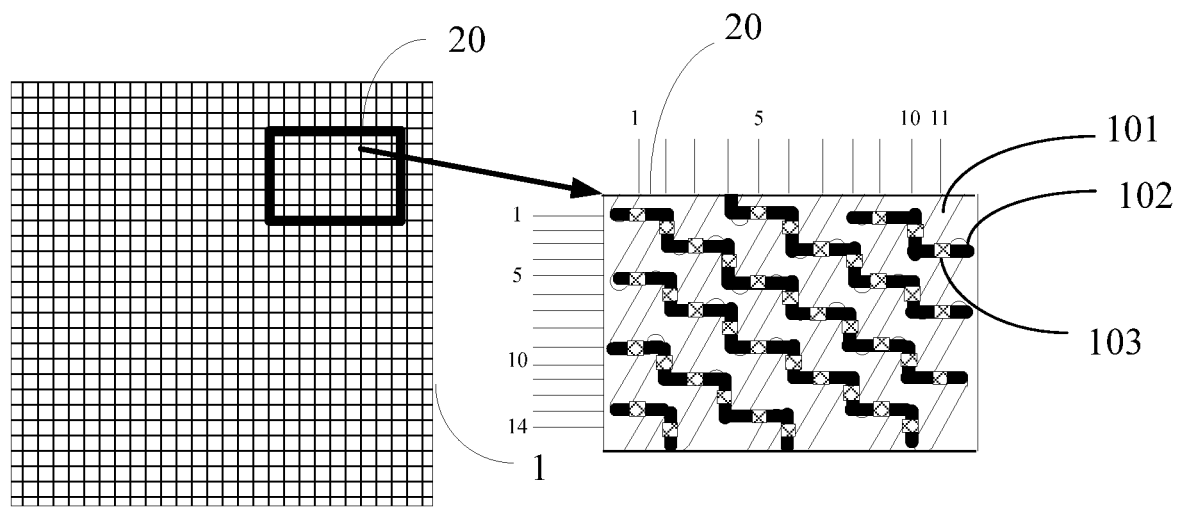
FIG. 1 illustrates a schematic structural diagram of a semiconductor structure according to an embodiment provided in the disclosure.

The disclosure provides a semiconductor structure. As illustrated in FIG. 1, the semiconductor structure 1 includes a memory array. The memory array includes multiple magnetic tunnel junctions (MTJs). The multiple MTJs can be arranged in rows and columns in an array, and each MTJ may be used for reading and writing of information. In FIG. 1, taking any rectangular region 20 in the semiconductor structure 1 as an example, the rectangular region 20 includes: multiple active regions 101 that are separate from one another and located on a substrate (not shown in the figure), multiple connecting pads 102 and multiple MTJs 103.

As an example, multiple separate active regions 101 may be formed in a semiconductor substrate. The semiconductor substrate includes a silicon substrate, a silicon on insulator (SOI) substrate, a gallium nitride substrate, silicon carbide, gallium carbide, etc. Specifically, the active regions 101 may be formed on the semiconductor substrate by a patterning process, and trench isolating structures are formed between the active regions 101.

Figure 2:
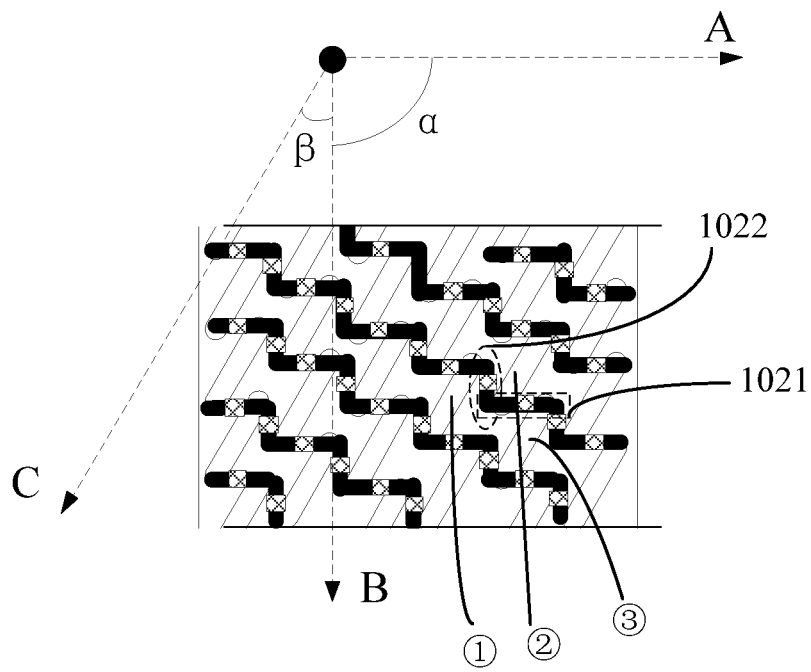
FIG. 2 illustrates a schematic diagram of extension directions of a semiconductor structure provided in the disclosure.

Referring to FIG. 2, multiple active regions 101 in the semiconductor substrate (not shown in the figure) are distributed in an array at equal intervals. Specifically, the multiple active regions 101 are strip-shaped, and extend in a third direction C.

The semiconductor substrate includes connecting pads 102. Each connecting pad 102 includes a first part 1021 and a second part 1022. Each of the first part 1021 and the second part 1022 is connected to end parts of respective adjacent active regions 101. The first part 1021 extends in a first direction A, and the second part 1022 extends in a second direction B. The first part 1021 and the second part 1022 may each have an end connected to the same end part of the same active region 101, and the other end of the first part 1021 and the other end of the second part 1022 are respectively connected to the end parts of different active regions 101.

Specifically, as illustrated in FIG. 2, the connecting pads 102 are located above the active regions 101 distributed in an array. The first part 1021 and the second part 1022 of the connecting pad 102 are strip-shaped. The first part 1021 of the connecting pad 102 extends in a first direction A, and the two ends of the first part 1021 are respectively connected to the end part of the active region 101 with a sign ②) and the end of the active region 101 with a sign ③. The second part 1022 of the connecting pad 102 extends in a second direction B, and the two ends of the second part 1022 are respectively connected to the end part of the active region 101 with a sign ① and the end of the active region 101 with a sign ②). In such a case, the same end part of the active region 101 with the sign ② may be connected to the first part 1021 and the second part 1022 respectively. An included angle β between the second direction B and the third direction C may be an acute angle, and the included angle may specifically range from 15° to 35°. An included angle α between the first direction A and the second direction B may be 90°. Exemplarily, in other possible implementations, the included angle α between the first direction A and the second direction B may also be less than 90°, and the implementation and principle are the same and will not be described again.

In some embodiments, the connecting pads extend in a stair shape. Specifically, the connecting pad connecting the end parts of three adjacent active regions 101 form a stair unit, and multiple stair units are connected to form connecting pads extending in a stair shape. Specifically, referring to FIG. 2, the first part 1021 and the second part 1022 form a stair unit, and multiple stair units on multiple active regions are connected to form connecting pads in a stair shape.

In some embodiments, as shown in FIG. 2, the active regions are distributed in a staggered array. The first part 1021 is connected to the end parts of the adjacent active regions 101 in different columns, and the second part 1022 is connected to end parts of the adjacent active regions 101 in the same column.

Each MTJ 103 may be connected to a respective connecting pad 102. As an example, a single connecting pad 102 may be connected to multiple MTJs 103. In FIG. 1, taking the rectangular region 20 including 39 MTJs 103 distributed in 14 rows and 11 columns as an example, each MTJ 103 is disposed above the space between two bent parts formed by the connecting pads 102 extending in a stair shape, and is connected to the connecting pad 102. Specifically, the MTJs 103 may be disposed above the middle points of the first part 1021 and the second part 1022 of the connecting pad 102 respectively and are connected to the first part 1021 and the second part 1022 of the connecting pad 102 respectively.

In some embodiments, as shown in FIG. 2, multiple MTJs 103 may be distributed in an array in the first direction A and the second direction B. The distance between each adjacent rows of MTJs 103 in the first direction A is the same, and the distance between each adjacent columns of MTJs 103 in the second direction B is the same.

Through s connecting pad 102, MTJs 103 may be connected to the end parts of multiple active regions 101 connected to the connecting pad 102. The end parts of the active region 101 may be a source electrode or a drain electrode of a transistor (the transistor may be a Negative-channel Metal Oxide Semiconductor (NMOS) transistor). In such a case, a single MTJ 103 may be driven by multiple transistors together.

In conclusion, in the semiconductor structure provided in the examples of the present disclosure, multiple transistors are connected by connecting pads, so that one MTJ can be driven by n transistors without reducing the memory density.

FIG. 1 and FIG. 2 illustrate schematic structural diagrams of the semiconductor structure 1. In order to realize the functions of the semiconductor structure 1, structures such as word lines, bit lines and selection lines also need to be provided for realizing the control over the MTJs 103. The layered design structure of the semiconductor structure 1 provided in the embodiments of the disclosure is described below with reference to FIG. 3 to FIG. 8. FIG. 3 to FIG. 8 are also depicted with the rectangular region 20 of the semiconductor structure 1 in FIG. 1 as an example.

Figure 3:
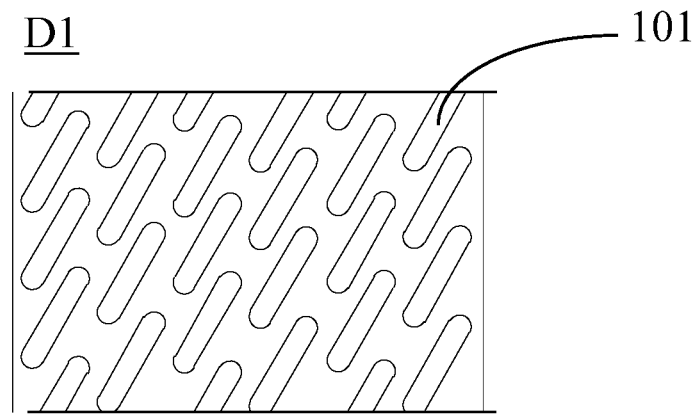
FIG. 3 illustrates a schematic structural diagram of a layer D1 of a semiconductor structure provided in the disclosure.

First layer (D1): FIG. 3 illustrates a schematic structural diagram of a layer D1 of a semiconductor structure provided in the disclosure. In the layer D1 as shown in FIG. 3, multiple separate active regions 101 are arranged at intervals, and the description of the active regions 101 may refer to the description of FIG. 1 and FIG. 2. Specifically, multiple separate active regions 101 may be formed in a silicon substrate by a patterning method. The patterning method includes, but is not limited to, semiconductor manufacturing processes such as self-aligned double patterning (SADP) and self-aligned quadruple patterning (SAQP). Trench isolating structures are formed between the active regions 101.

Figure 4:
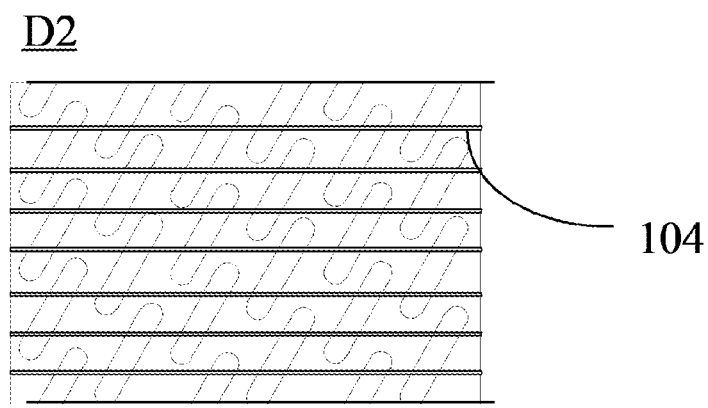
FIG. 4 illustrates a schematic structural diagram of a layer D2 of a semiconductor structure provided in the disclosure.

Second layer (D2): FIG. 4 illustrates a schematic structural diagram of a layer D2 of a semiconductor structure provided in the disclosure. Multiple word lines 104 are disposed in parallel in the layer D2 as shown in FIG. 4, and the word lines 104 are configured to control the transistors connected to the MTJs 103. As an example, the word lines 104 at the layer D2 may be disposed above the layer D1. In another example, the word lines 104 at the layer D2 may also be arranged to pass through the active region 101 at the layer D1. A single active region 101 may be divided into two end parts and a middle part by two adjacent word lines 104. Specifically, the active region 101 and the two word lines 104 passing therethrough form two transistors (MOS transistors). The two transistors share the same source electrode. The middle part of the active region 101 is the source electrode shared by the two transistors, and the two end parts of the active region 101 are drain electrodes of the two transistors respectively. Alternatively, the two transistors share the same drain electrode. The middle part of the active region 101 is the drain electrode shared by the two transistors, and the two end parts of the active region 101 are source electrodes of the two transistors respectively. In an example, the word lines 104 may be buried gate lines.

In some embodiments, the word lines 104 may extend in the first direction A, and a single word line 104 may pass through multiple active regions 101.

Figure 5:
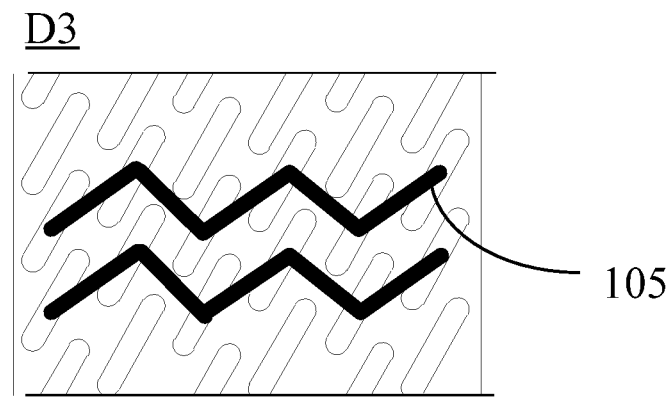
FIG. 5 illustrates a schematic structural diagram of a layer D3 of a semiconductor structure provided in the disclosure.
Figure 9:
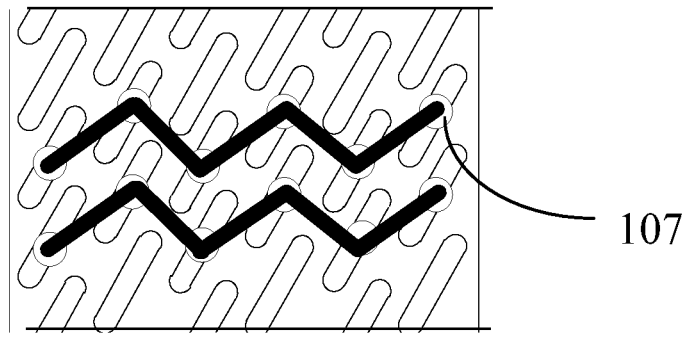
FIG. 9 illustrates a schematic structural diagram of first plugs according to an embodiment provided in the disclosure.

Third layer (D3): FIG. 5 illustrates a schematic structural diagram of a layer D3 of a semiconductor structure provided in the disclosure. Multiple selection lines 105 are provided in the layer D3 as shown in FIG. 5. The selection lines 105 may be polylines and may extend in the same direction as the word lines 104. As an example, the selection lines 105 may extend in the first direction A. The layer D3 may be disposed above the layer D1, and the selection lines 105 may be connected to the middle parts of respective active regions 101 through contact plugs. Specifically, a middle part of an active region 101 is a shared source electrode or a shared drain electrode of two transistors, and the selection line 105 may be connected to the shared source electrode or the shared drain electrode of the two transistors through a contact plug. As shown in FIG. 9, a first plug 107 may be located between the layer D1 and the layer D3, and the middle part of the active region 101 may be connected to the selection line 105 by the first plug 107. A single selection line 105 may be connected to the middle parts of multiple active regions 101.

Figure 6:
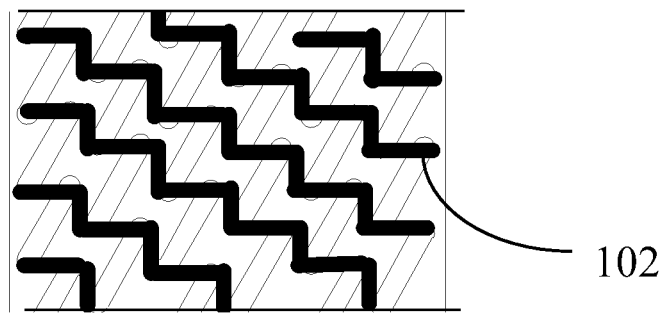
FIG. 6 illustrates a schematic structural diagram of a layer D4 of a semiconductor structure provided in the disclosure.

Fourth layer (D4): FIG. 6 illustrates a schematic structural diagram of a layer D4 of a semiconductor structure provided in the disclosure. Multiple connecting pads 102 are provided in the layer D4 as shown in FIG. 6, and the description of the connecting pads 102 may refer to the description of FIG. 1 and FIG. 2.

Figure 10:
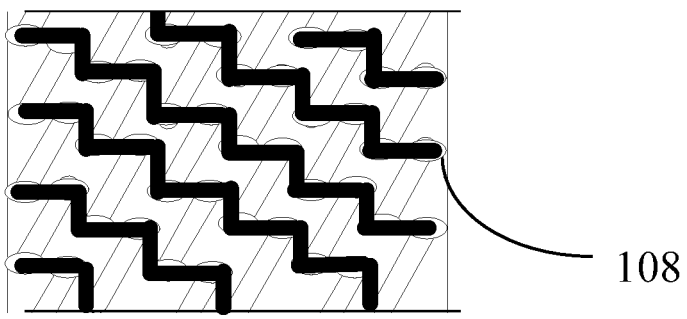
FIG. 10 illustrates a schematic structural diagram of second plugs according to an embodiment provided in the disclosure.

In some embodiments, the connecting pads 102 may be connected to the end parts of the active regions 101 by second plugs. FIG. 10 illustrates a schematic structural diagram of second plugs provided in the disclosure according to an embodiment. As shown in FIG. 10, the second plugs 108 are located between the layer D1 and the layer D4. One end of a second plug 108 is connected to an end part of an active region 101, and the other end of the second plug 108 is connected to a connecting pad 102. With reference to FIG. 9 and FIG. 10, the first plugs 107 may have a smaller height than the second plug 108, so that the bit lines 105 are located below the connecting pads 102 so that the subsequent connection of the MTJs 103 is not disturbed. In other examples, the first plugs 107 may have a greater height than the second plugs 108.

Figure 7:
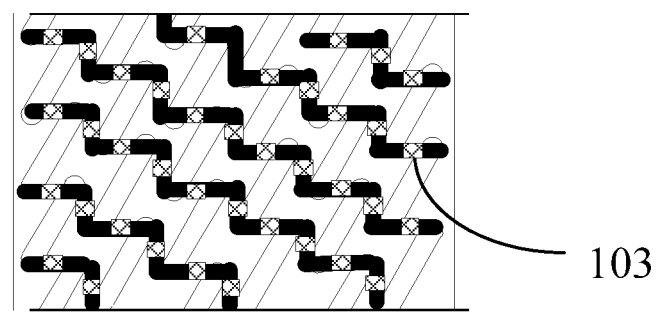
FIG. 7 illustrates a schematic structural diagram of a layer D5 of a semiconductor structure provided in the disclosure.

Fifth layer (D5): FIG. 7 illustrates a schematic structural diagram of a layer D5 of a semiconductor structure provided in the disclosure. Multiple MTJs 103 are provided in the layer D5 as shown in FIG. 7. As an example, the MTJs 103 are located above the connecting pads 102 and are connected to the connecting pads 102. An MTJ 103 includes a free layer, a fixed layer and a tunnel barrier, and stores information by directions of magnetic polarization of the free layer and the fixed layer. For example, when the directions of magnetic polarization of the free layer and the fixed layer are in a parallel state, the resistance is low, which represents the information "1"; and when the directions of magnetic polarization of the free layer and the fixed layer are in an anti-parallel state, the resistance is high, which represents the information "0".

Figure 8:
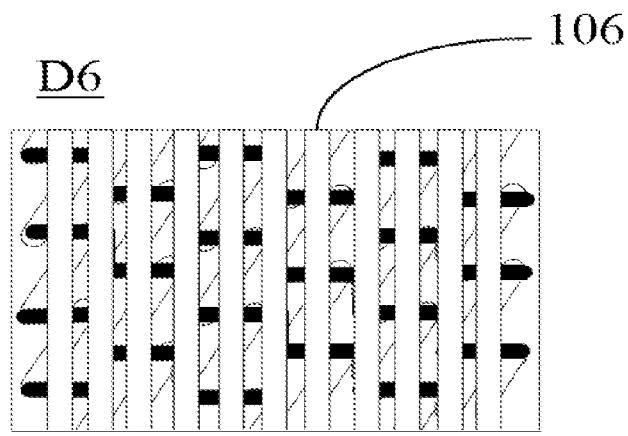
FIG. 8 illustrates a schematic structural diagram of a layer D6 of a semiconductor structure provided in the disclosure.

Sixth layer (D6): FIG. 8 illustrates a schematic structural diagram of a layer D6 of a semiconductor structure provided in the disclosure. Multiple bit lines 106 are provided in the layer D6 as shown in FIG. 8, and the bit lines 106 extend in the second direction B. For example, for the 11 columns of MTJs 103 distributed in FIG. 1, 11 bit lines may be correspondingly provided in the layer D6, and each bit line 106 is configured to connect the upper ends of a row of MTJs 103 in the second direction B as shown in FIG. 1 and FIG. 2.

Figure 11:
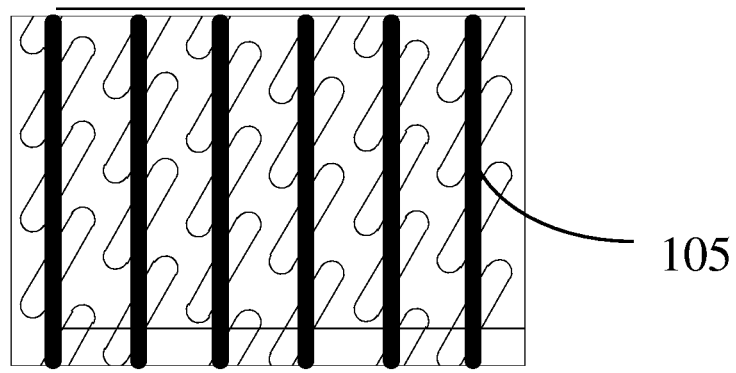
FIG. 11 illustrates a schematic structural diagram of a layer D3 of a semiconductor structure according to another embodiment provided in the disclosure.

In some embodiments, the disclosure further provides another semiconductor structure which may be used as an equivalent replacement of the semiconductor structure 1 provided in FIG. 3 to FIG. 8. FIG. 11 illustrates a schematic structural diagram of a layer D3 of a semiconductor structure according to another embodiment provided in the disclosure. Multiple selection lines 105 are provided in the layer D3 as shown in FIG. 11. The selection lines 105 are straight lines, and extend in a direction perpendicular to a direction in which the word lines 104 extend. As an example, the selection lines 105 may extend in the second direction B, and a single selection line 105 may be connected to the middle parts of the active regions 101 in the same column. The structures of the layer D1, the layer D2, the layer D4, the layer D5 and the layer D6 are the same as those in the previous embodiment, and will not be described again.

Figure 12:
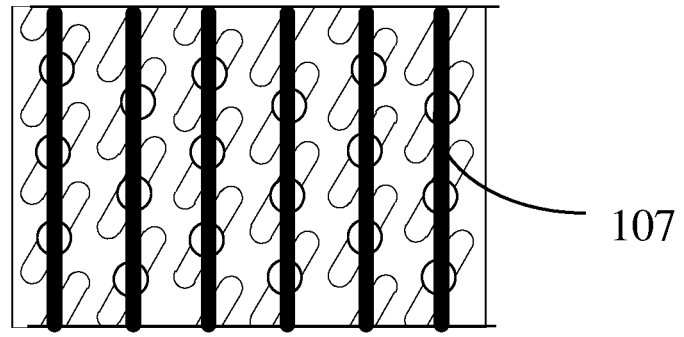
FIG. 12 illustrates a schematic structural diagram of first plugs according to another embodiment provided in the disclosure.
Figure 13:
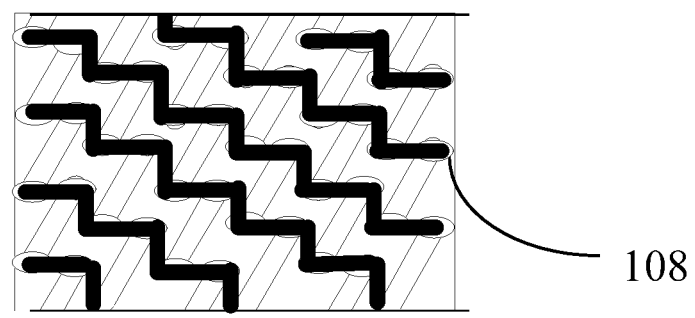
FIG. 13 illustrates a schematic structural diagram of second plugs according to another embodiment provided in the disclosure.

In some embodiments, the selection lines 105 may be connected to the active regions 101 by first plugs. FIG. 12 illustrates a schematic structural diagram of first plugs according to another embodiment provided in the disclosure. As shown in FIG. 12, the first plugs 107 are located between the layer D1 and the layer D3, and the middle parts of the active regions 101 may be connected to the selection lines 105 by the first plugs 107. Specifically, the middle parts of the active regions 101 in the same column may be connected to the same selection line 105. The connecting pad 102 may be connected to the end parts of the adjacent active regions 101 by second plugs. FIG. 13 illustrates a schematic structural diagram of second plugs according to another embodiment provided in the disclosure. As shown in FIG. 13, the second plugs 108 are located between the layer D1 and the layer D4. One end of a second plug 108 is connected to an end part of an active region 101, and the other end of the second plug 108 is connected to the connecting pad 102.

In some embodiments, with reference to FIG. 12 and FIG. 13, the first plugs 107 may have a height equal to that of the second plugs 108. In such a case, the layer D3 and the layer D4 may be located at the same layer. As an example, the first plugs 107 and the second plugs 108 may be formed in the same process step. For example, a conductive material may be simultaneously formed in first through holes for preparing the first plugs and second through holes for preparing the second plugs, so as to form the first plugs and the second plugs. The conductive material may be at least one of TiN, W, TaN, Co, AL, WN, polysilicon and silicon germanide.

Another embodiment of the disclosure provides a memory cell, including: a transistor, and a memory structure. One end of the transistor is connected to one end of the memory structure. The other end of the transistor, a gate electrode of the transistor, the other end of the memory structure, and the end of the transistor connected to the memory structure are respectively used as a first end, a second end, a third end and a fourth end of the memory cell.

Figure 14:
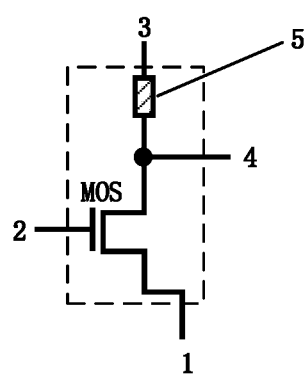
FIG. 14 illustrates a schematic diagram of a memory cell provided in the disclosure.

As shown in FIG. 14, a metal oxide semiconductor (MOS) transistor includes a gate electrode 2, and two ends of the MOS transistor are respectively a source electrode and a drain electrode. When one end of the MOS transistor is a source electrode, the other end of the MOS transistor is a drain electrode; or when one end of the MOS transistor is a drain electrode, the other end of the MOS transistor is a source electrode. The transistor may be an NMOS transistor or a PMOS transistor.

In some embodiments, a memory structure 5 may include at least one of: a magnetic tunnel junction (MTJ), a capacitive memory structure, a resistive memory structure and a phase change memory structure. As an example, when the memory structure 5 is an MTJ, the MTJ may include a free layer, a fixed layer and a tunnel barrier. Specifically, the fixed layer of the MTJ is connected to the source electrode of the MOS transistor. The free layer of the MTJ may be used as the third end 3 of the memory cell. The drain electrode of the MOS transistor may be used as the first end 1 of the memory cell. The gate electrode of the MOS transistor may be used as the second end 2 of the memory cell. The source electrode of the MOS transistor connected to the fixed layer of the MTJ may be used as the fourth end 4 of the memory cell.

Figure 15:
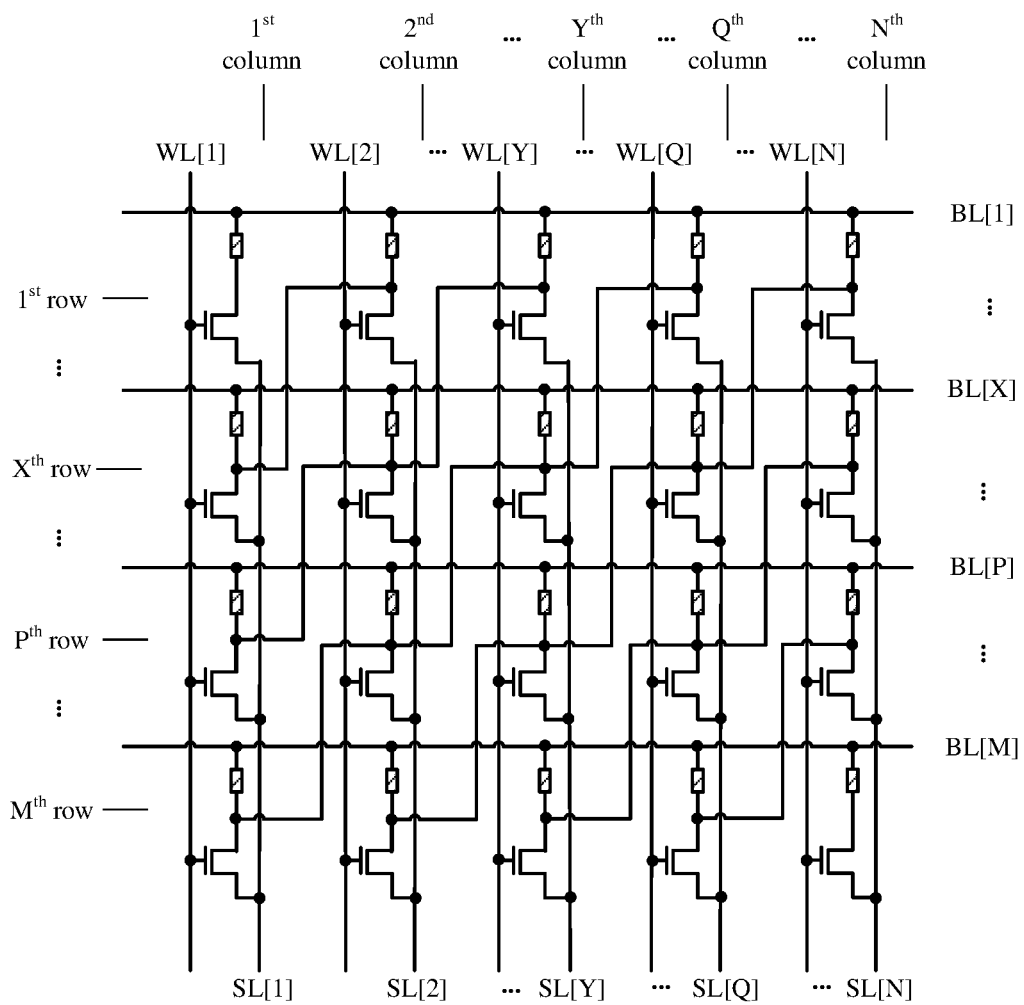
FIG. 15 illustrates a schematic diagram of a memory array provided in the disclosure.

Another embodiment of the disclosure provides a memory array. The memory array includes M*N memory cells forming an array of M rows and N columns. Both M and the N are positive integers greater than or equal to 2. The memory array further includes M bit lines in one-to-one correspondence to the M rows of memory cells. Third ends of memory cells in each of the M rows are all connected to a corresponding one of the M bit lines. The memory array further includes N word lines in one-to-one correspondence to the N columns of memory cells. Second ends of memory cells in each of the N columns are all connected to a corresponding one of the N word lines. A fourth end of a memory cell in an $X^{th}$ row and $Y^{th}$ column is connected to a fourth end of a memory cell in a $P^{th}$ row a $Q^{th}$ column, X is equal to P minus A, and Y is equal to Q minus B As shown in FIG. 15, M*N memory cells form an array of M rows and N columns, and both M and N are positive integers greater than or equal to 2. M bit lines (BL) are BL[1] to BL[M] respectively. The M bit lines are in one-to-one correspondence to M rows of memory cells. Third ends 3 of the memory cells in the same row are all connected to the corresponding bit lines BL. For example, the third ends 3 of the memory cells in first row are all connected to the bit lines BL[1] in the first row, and the third ends 3 of the memory cells in the $X^{th}$ row are all connected to the bit lines BL[X] in the $X^{th}$ row. N word lines WL are respectively WL[1] to WL[N]. The N word lines are in one-to-one correspondence to the N columns of memory cells. Second ends 2 of the memory cells in the same column are all connected to the corresponding word lines WL. For example, the second ends 2 of the memory cells in the first column are all connected to the word lines WL[1] in the first column, and the second ends 2 of the memory cells in the $X^{th}$ column are all connected to the word lines WL[X] in the $X^{th}$ column. The fourth end 4 of the memory cell in the $X^{th}$ row and $Y^{th}$ column is connected to the fourth end 4 of the memory cell in the $P^{th}$ row and $Q^{th}$ column. X is equal to P minus A, and Y is equal to Q minus B.

As an example, A is equal to B. Specifically, the fourth end 4 of the memory cell in the $X^{th}$ row and $Y^{th}$ column is connected to the fourth end 4 of the memory cell in the $(X+B)^{th}$ row and $(Y+B)^{th}$ column. B may be any integer such as 1, 2 and 3. For example, the fourth end 4 of the memory cell in the tenth row and tenth column is connected to the fourth end 4 of the memory cell in the eleventh row and eleventh column, or the fourth end 4 of the memory cell in the tenth row and tenth column is connected to the fourth end 4 of the memory cell in the twelfth row and twelfth column.

In some embodiments, N selection lines SL are in one-to-one correspondence to the N columns of memory cells. First ends 1 of the memory cells in the same column are connected to the corresponding selection lines SL. As shown in FIG. 15, the first ends 1 of the memory cells in the first column are connected to the selection line SL[1] in the first column, and the first ends 1 of the memory cells in the $Y^{th}$ column is connected to the selection line SL[Y] in the $Y^{th}$ column.

In some embodiments, among the M*N memory cells, the fourth ends 4 of all memory cells, between which a distance in a row direction is A and a distance in a column direction is B, are connected together. For example, when both A and B are equal to 1, the fourth end 4 of the memory cell in the $M^{th}$ row and first column, the fourth end 4 of the memory cell in the $(M-1)^{th}$ row and second column, the fourth end 4 of the memory cell in the $(M-2)^{th}$ row and third column . . . are all connected together.

Figure 16:
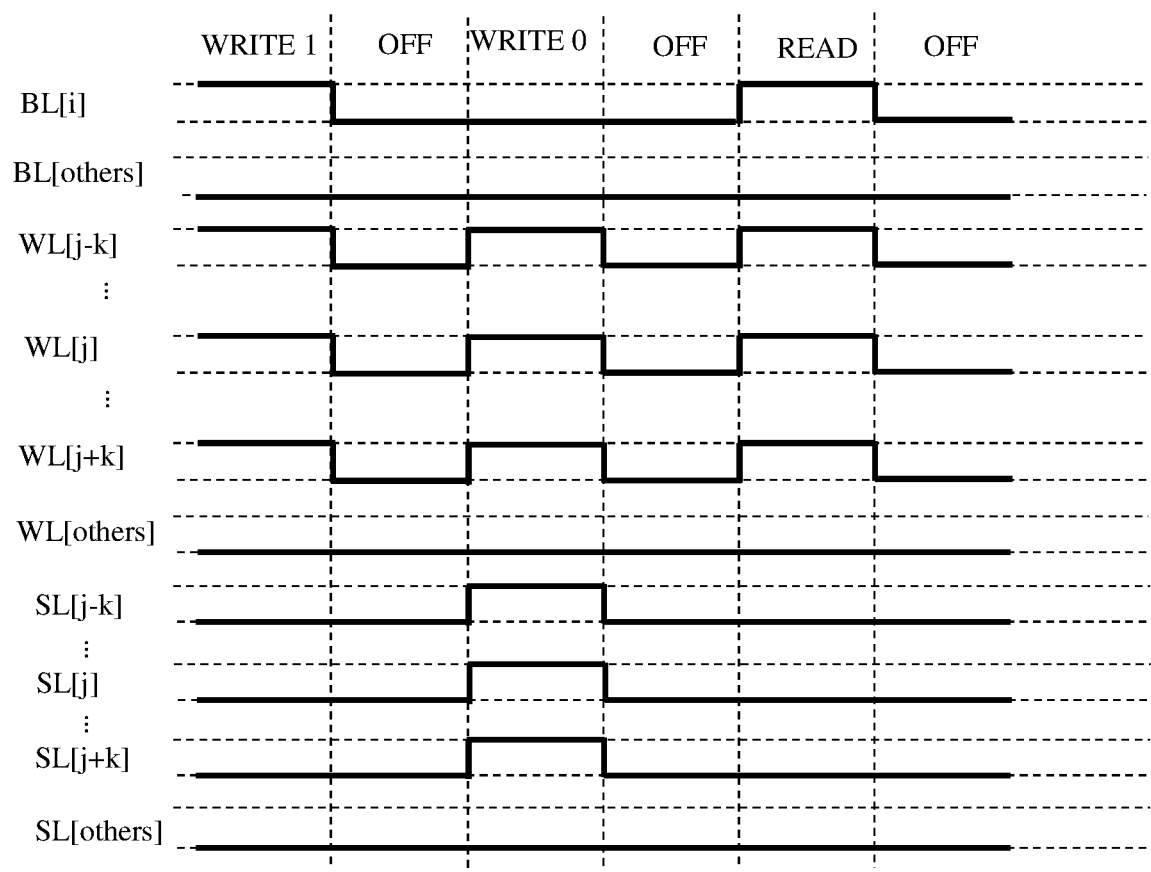
FIG. 16 illustrates a schematic diagram of control levels of MTJs provided in the disclosure.

FIG. 16 illustrates a schematic diagram of control levels of MTJs provided in the disclosure. As an example, when the memory structure 5 is an MTJ, the MTJ in the memory cell in the $i^{th}$ row and $j^{th}$ column is marked as $M_{ij}$. When writing information "1" (WRITE1) through the MTJ $M_{ij}$, the bit line BL[i] in the $i^{th}$ row connected to the MTJ $M_{ij}$ is set to a high level, and the other bit lines BL[others] are set to a low level; and word lines WL[j−k] to WL[j+k] in the $(j−k)^{th}$ column to the $(j+k)^{th}$ column are set to a high level, and the other word lines WL[others] are set to a low level; and selection lines SL are all set to a low level. When writing information "0" (WRITE0) through the MTJ $M_{ij}$, bit lines BL are all set to a low level; word lines WL[j−k] to WL[j+k] in the $(j−k)^{th}$ column to the $(j+k)^{th}$ column are set to a high level, and the other word lines WL[others] are set to a low level; and selection lines SL[j−k] to SL[j+k] in the $(j−k)^{th}$ column to the $(j+k)^{th}$ column corresponding to WL[j−k] to WL[j+k] are set to a high level, and the other selection lines SL[others] are set to a low level. When reading information (READ) from the MTJ $M_{ij}$, the bit line BL[i] in the $i^{th}$ row connected to the MTJ $M_{ij}$ is set to a high level, and the other bit lines BL[others] are set to a low level' word lines WL[j−k] to WL[j+k] in the (j−k)$^{th}$ column to the (j+k)$^{th}$ column are set to a high level, and other word lines WL[others] are set to a low level; and selection lines SL are all set to a low level. In this example, the number of transistors operating the same MTJ $M_{ij}$ is j+k−(j−k)+1, that is, 2k+1 transistors operate one MTJ.

In the disclosure, by connecting transistors connected to multiple memory structures, the purpose of driving the same memory structure by multiple transistors can be realized, and it is also ensured that the memory density is not reduced.

The above embodiments only serve to illustrate the technical solutions of the disclosure, but are not limited thereto. Although the embodiments of the disclosure are described in detail with reference to the above embodiments, it should be understood by those skilled in the art that the technical solutions described in the foregoing embodiments may be modified, or some or all of the technical features may be equivalently replaced. However, the essence of the corresponding technical solutions resulting from these modifications or replacements does not depart from the scope of the technical solutions of the embodiments of the disclosure.

The invention claimed is:

1. A semiconductor structure, comprising:
   active regions that are separate from one another and located on a substrate;
   connecting pads, wherein each of the connecting pads comprises a first part and a second part, each of the first part and the second part is connected to end parts of respective adjacent ones of the active regions, the first part extends in a first direction, and the second part extends in a second direction;
   memory structures, wherein each of the memory structures is connected to a respective one of the connecting pads; and
   word lines passing through the active regions, wherein two of the word lines divide one of the active regions into two end parts and a middle part;
   wherein a transistor is formed by one of the two end parts of the one of the active regions, the middle part of the one of the active regions, and a corresponding word line; a memory cell is formed by the transistor and a corresponding one of the memory structures; one end of the transistor formed by the one of the two end parts of the one of the active regions is connected to one end of the corresponding one of the memory structures; and a second end of the transistor, a gate electrode of the transistor, a second end of the corresponding one of the memory structures, and the one end of the transistor connected to the corresponding one of the memory structures are respectively used as a first end, a second end, a third end and a fourth end of the memory cell; and,
   wherein the semiconductor structure comprises M*N the memory cells forming an array of M rows and N columns, and both the M and the N are positive integers greater than or equal to 2;
   M bit lines in one-to-one correspondence to the M rows of memory cells, wherein the third ends of memory cells in each of the M rows are all connected to a corresponding one of the M bit lines; and
   N word lines in one-to-one correspondence to the N columns of memory cells, wherein the second ends of memory cells in each of the N columns are all connected to a corresponding one of the N word lines, wherein a fourth end of a memory cell in an $X^{th}$ row and $Y^{th}$ column is connected to a fourth end of a memory cell in a $P^{th}$ row and a $Q^{th}$ column by the connecting pads, X is equal to P minus A, and Y is equal to Q minus B, wherein the X, the P and the A are positive integers less than or equal to the M, and the Y, the Q, and the B are positive integers less than or equal to the N.

2. The semiconductor structure of claim 1, wherein the first part and the second part are connected to a same end part of the one of the active regions.

3. The semiconductor structure of claim 2, wherein the connecting pads extend in a stair shape.

4. The semiconductor structure of claim 1, wherein the active regions are strip-shaped and extend in a third direction.

5. The semiconductor structure of claim 4, wherein an included angle between the second direction and the third direction ranges from 15° to 35°.

6. The semiconductor structure of claim 1, further comprising: selection lines, wherein each of the selection lines is connected to the middle parts of respective active regions.

7. The semiconductor structure of claim 6, wherein the selection lines are polylines, and extend in a same direction as the word lines.

8. The semiconductor structure of claim 7, further comprising:
   first plugs connecting the middle parts of the active regions to the selection lines; and
   second plugs connecting the end parts of the active regions to the connecting pads, wherein the first plugs have a smaller height than the second plugs.

9. The semiconductor structure of claim 6, wherein the selection lines are straight lines, and extend in a direction perpendicular to a direction in which the word lines extend.

10. The semiconductor structure of claim 9, further comprising:
    first plugs connecting the middle parts of the active regions to the selection lines; and
    second plugs connecting the end parts of the active regions to the connecting pads, wherein the first plugs have a same height as the second plugs.

11. The semiconductor structure of claim 10, wherein the first plugs and the second plugs are formed in a same process step.

12. The semiconductor structure of claim 1, further comprising:
    bit lines, wherein each of the bit lines is connected to respective memory structures and extend in the second direction.

13. A memory array, comprising:
    M*N memory cells forming an array of M rows and N columns, wherein both M and the N are positive integers greater than or equal to 2, and each memory cell comprises a transistor and a memory structure, one end of the transistor is connected to one end of the memory structure, and a second end of the transistor, a gate electrode of the transistor, a second end of the memory structure, and the one end of the transistor connected to the memory structure are respectively used as a first end, a second end, a third end and a fourth end of the memory cell;
    M bit lines in one-to-one correspondence to the M rows of memory cells, wherein the third ends of memory cells in each of the M rows are all connected to a corresponding one of the M bit lines; and N word lines in one-to-one correspondence to the N columns of memory cells, wherein the second ends of memory cells in each of the N columns are all connected to a corresponding one of the N word lines, wherein a fourth end of a memory cell in an $X^{th}$ row and $Y^{th}$ column is connected to a fourth end of a memory cell in a $P^{th}$ row and a $Q^{th}$ column, X is equal to P minus A, and Y is equal to Q minus B; and, wherein the X, the P and the A are positive integers less than or equal to the M, and the Y, the Q, and the B are positive integers less than or equal to the N.

14. The memory array of claim 13, wherein A is equal to B.

15. The memory array of claim 14, wherein both A and B are equal to 1.

16. The memory array of claim 13, further comprising: N selection lines in one-to-one correspondence to the N columns of memory cells, and the first ends of memory cells in each of the N columns are connected to a corresponding one of the N selection lines.

17. The memory array of claim 13, wherein among the M*N memory cells, fourth ends of all memory cells, which are spaced apart from each other in a row direction by a number of rows equal to A and spaced apart from each other in a column direction by a number of columns equal to B, are connected together.

18. The memory array of claim 13, wherein the memory structure comprises at least one of:
   a magnetic tunnel junction (MTJ),
   a capacitive memory structure,
   a resistive memory structure, or
   a phase change memory structure.

* * * * *